US008218126B2

(12) United States Patent
Steffens et al.

(10) Patent No.: US 8,218,126 B2
(45) Date of Patent: Jul. 10, 2012

(54) LITHOGRAPHIC APPARATUS AND DEVICE MANUFACTURING METHOD

(75) Inventors: Koen Steffens, Veldhoven (NL); Paulus Martinus Maria Liebregts, Veldhoven (NL); Ronald Van Der Ham, Maarheeze (NL); Daniël Jozef Maria Direcks, Simpelveld (NL); Gert-Jan Gerardus Johannes Thomas Brands, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 559 days.

(21) Appl. No.: 12/314,023

(22) Filed: Dec. 2, 2008

(65) Prior Publication Data

US 2009/0147227 A1 Jun. 11, 2009

Related U.S. Application Data

(60) Provisional application No. 60/996,878, filed on Dec. 10, 2007.

(51) Int. Cl.
G03B 27/42 (2006.01)

(52) U.S. Cl. ........................................................ 355/53

(58) Field of Classification Search .................... 355/30, 355/53; 430/395; 378/34
See application file for complete search history.

(56) References Cited

U.S. PATENT DOCUMENTS

| 4,509,852 | A | 4/1985 | Tabarelli et al. |
| 6,952,253 | B2 | 10/2005 | Lof et al. |
| 7,161,654 | B2 | 1/2007 | Baselmans et al. |
| 7,423,720 | B2 | 9/2008 | Verspay et al. |
| 7,514,699 | B2 | 4/2009 | Neijzen et al. |
| 7,701,550 | B2 | 4/2010 | Kemper et al. |
| 7,924,403 | B2 | 4/2011 | Liebregts et al. |
| 7,932,989 | B2 | 4/2011 | Novak et al. |
| 2004/0136494 | A1 | 7/2004 | Lof et al. |
| 2006/0103821 | A1 | 5/2006 | Verspay et al. |
| 2006/0119807 | A1 | 6/2006 | Baselmans et al. |
| 2006/0290909 | A1* | 12/2006 | Donders et al. ................. 355/53 |
| 2007/0110213 | A1 | 5/2007 | Leenders et al. |
| 2007/0268466 | A1 | 11/2007 | Leenders et al. |
| 2008/0212046 | A1 | 9/2008 | Riepen et al. |
| 2010/0195067 | A1 | 8/2010 | Nagasaka et al. |

FOREIGN PATENT DOCUMENTS

| EP | 1 420 300 A2 | 5/2004 |
| EP | 1 628 163 A2 | 2/2006 |
| JP | 2004-259966 | 9/2004 |
| JP | 2004-320017 A | 11/2004 |
| JP | 2006-060223 | 3/2006 |
| JP | 2006-511011 | 3/2006 |

(Continued)

OTHER PUBLICATIONS

Japanese Office Action dated Jul. 25, 2011 in corresponding Japanese Patent Application No. 2008-308934.

(Continued)

*Primary Examiner* — Edward Glick
*Assistant Examiner* — Michelle Iacoletti
(74) *Attorney, Agent, or Firm* — Pillsbury Winthrop Shaw Pittman LLP (57) ABSTRACT

A liquid handling system is disclosed in which an extractor to contain liquid in a space between the projection system of a lithographic apparatus and a substrate has, in plan, a shape with a single corner. The extractor is provided in a rotatable part of a liquid handling system. The rotatable part is rotated under the control of a controller.

32 Claims, 7 Drawing Sheets

FOREIGN PATENT DOCUMENTS

| | | |
|---|---|---|
| JP | 2006-140494 | 6/2006 |
| JP | 2006-165500 | 6/2006 |
| JP | 2006-165550 | 6/2006 |
| JP | 2006-196906 | 7/2006 |
| JP | 2006-523029 | 10/2006 |
| JP | 2007-318117 | 12/2007 |
| JP | 2008-147652 | 6/2008 |
| WO | WO 99/49504 A1 | 9/1999 |
| WO | 2004/057589 | 7/2004 |
| WO | 2004/092830 | 10/2004 |

OTHER PUBLICATIONS

Japanese Office Action dated Apr. 18, 2011 in corresponding Japanese Patent Application No. 2008-308934.

* cited by examiner

LITHOGRAPHIC APPARATUS AND DEVICE MANUFACTURING METHOD

This application claims priority and benefit under 35 U.S.C. §119(e) to U.S. Provisional Patent Application No. 60/996,878, entitled "Lithographic Apparatus and Device Manufacturing Method", filed on Dec. 10, 2007. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water, although another liquid may be used. An embodiment of the present invention will be described with reference to liquid. However, another fluid may be suitable, particularly a wetting fluid, an incompressible fluid and/or a fluid with a higher refractive index than air, desirably a higher refractive index than water such as a hydrocarbon, such as a hydrofluorocarbon. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein. The particles may be of the size of nano particles and may be provided in a concentration that increases the refractive index of the liquid in which they are suspended.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
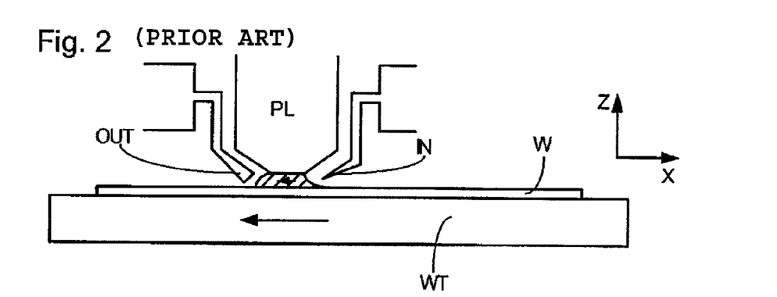
FIGS. 2 and 3 depict a liquid supply system for use in a lithographic projection apparatus.
Figure 3:
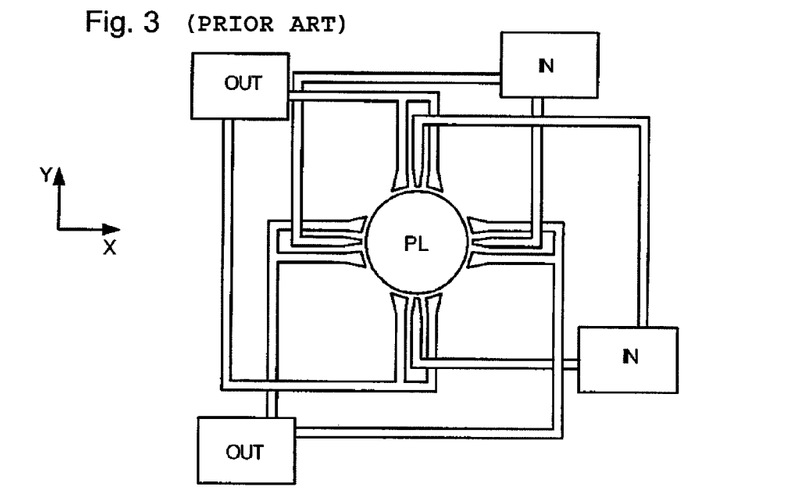

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
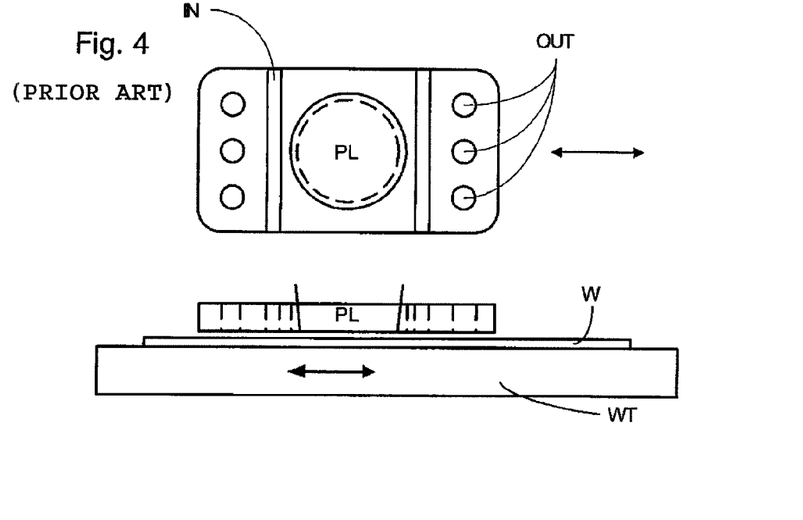
FIG. 4 depicts a further liquid supply system for use in a lithographic projection apparatus.

An immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center and through which the projection is project. Liquid is supplied by one groove inlet IN on one side of the projection system PS and removed by a plurality of discrete outlets OUT on the other side of the projection system PL. This causes a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

United States patent application publication no. US 2006/0103821 discloses an immersion lithography apparatus in which immersion liquid is supplied to a localized space. The space is substantially polygonal, in plan. A gas curtain which is provided to substantially seal the liquid in the space also has a polygonal shape. This arrangement may reduce the chance of droplets being deposited at an edge of the space during relative movement of the substrate to the gas curtain. This may be achieved because the length of an edge zone is decreased by use of the polygonal shape.

United States patent application publication no. US 2006/0119807 discloses a liquid supply system which is configured to rotate an inlet which supplies liquid to a space between the projection system and the substrate, an outlet which extracts liquid from the space, or both, about an axis substantially perpendicular to an exposure plane of the substrate.

SUMMARY

It is desirable, for example, to provide a liquid handling system with which the occurrence of drying stains on the substrate is reduced or avoided.

According to an aspect of the invention, there is provided an immersion lithographic apparatus comprising: a liquid handling system comprising a feature for exerting a force on a liquid for containing the liquid to a space to which immersion liquid is provided in use, the feature surrounding the space and having, in plan, a shape with a single corner.

According to an aspect of the invention, there is provided an immersion lithographic apparatus comprising a liquid handling system comprising: a body held substantially rotationally stationary relative to a projection system; and a rotatable part configured to be rotatable relative to the body about an axis substantially parallel to an optical axis of the projection system, the rotatable part comprising an inlet for liquid and/or gas, or an outlet for liquid and/or gas, or both the inlet and the outlet.

According to an aspect of the invention, there is provided an immersion lithographic apparatus comprising: a feature that surrounds a space to which immersion liquid is provided in use, the feature being constructed and arranged to contain liquid in a space to which immersion liquid is provided in use and having, in plan, a shape, wherein the feature is rotatable around an axis substantially parallel to an optical axis of the apparatus; and a controller constructed and arranged to control rotation of the feature around the axis and to rotate the shape to reduce the maximum speed of a substrate and/or substrate table moving under the feature relative to the feature in a direction substantially perpendicular to a local direction of a trailing edge of the shape.

According to an aspect of the invention, there is provided an immersion lithographic apparatus comprising:

a substrate support configured to support a substrate;

a liquid handling system comprising a liquid confinement structure shaped in a plan view to have a corner; and a controller configured to control the position of the liquid confinement structure such that the corner is positioned at a trailing edge of the liquid confinement structure during relative movement between the liquid handling system and the substrate and/or substrate support.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
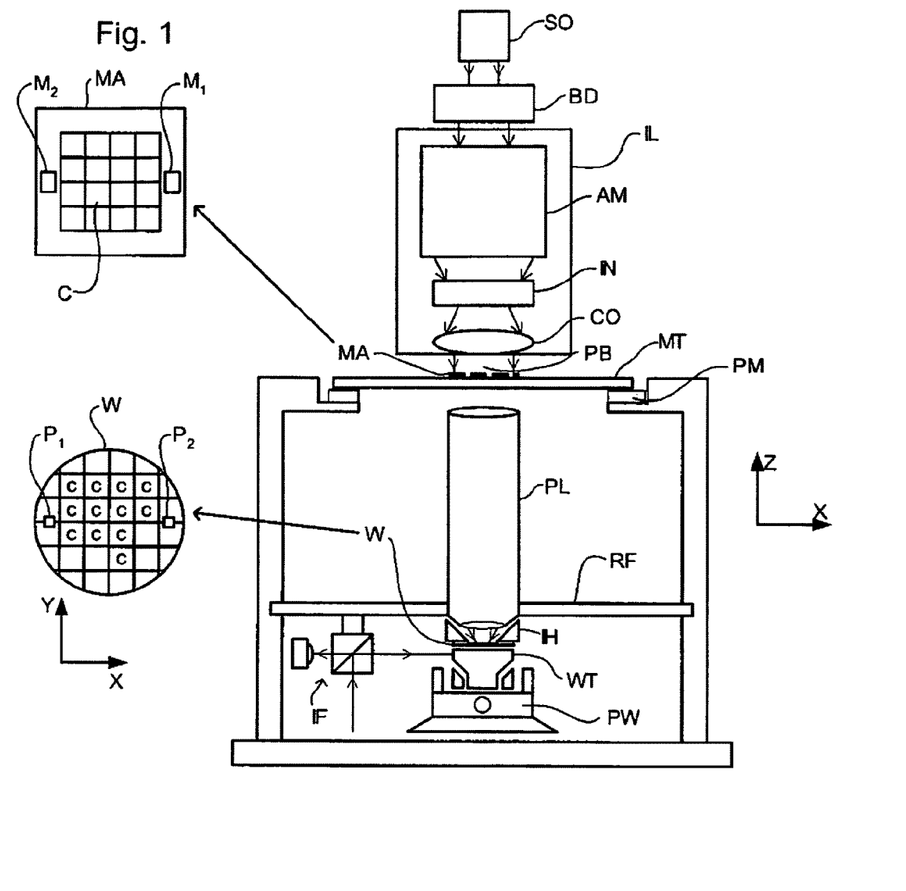
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An embodiment of the present invention is applicable to any type of extraction system, particularly for a localized area liquid handling system in which liquid is provided to a localized area of the substrate and/or substrate table. Several embodiments of extractor which confine or contain liquid in a space between the final element of the projection system and the substrate will be described. This is merely to illustrate that an embodiment of the present invention may be applied to many different sorts of extractors. An embodiment of the present invention is not limited only to the types of extraction system disclosed herein and can be applied to any type of extractor.

Figure 5:
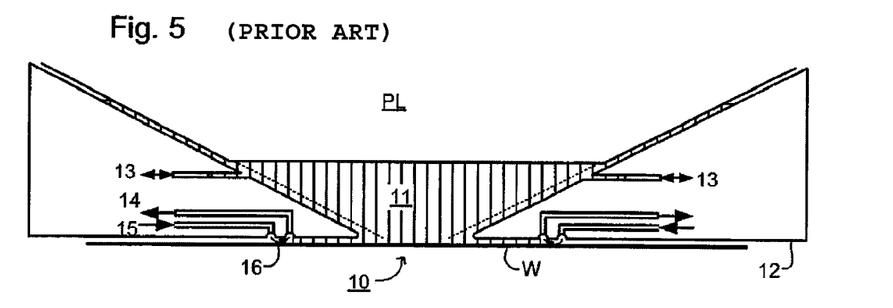
FIG. 5 depicts another liquid supply system for use in a lithographic projection apparatus.

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). A seal is formed between the barrier member and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a barrier member 12 positioned below and surrounding the final element of the projection system PL. Liquid is brought into the space below the projection system and within the barrier member 12 through, for example, port 13. In an embodiment, liquid may be removed from the space by port 13. The barrier member 12 extends a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. Pat. No. 6,952,253, hereby incorporated in its entirety by reference.

Figure 6:
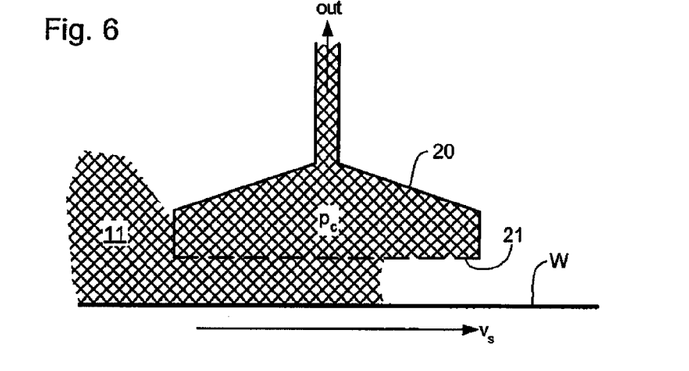
FIG. 6 depicts a liquid removal device.
Figure 7:
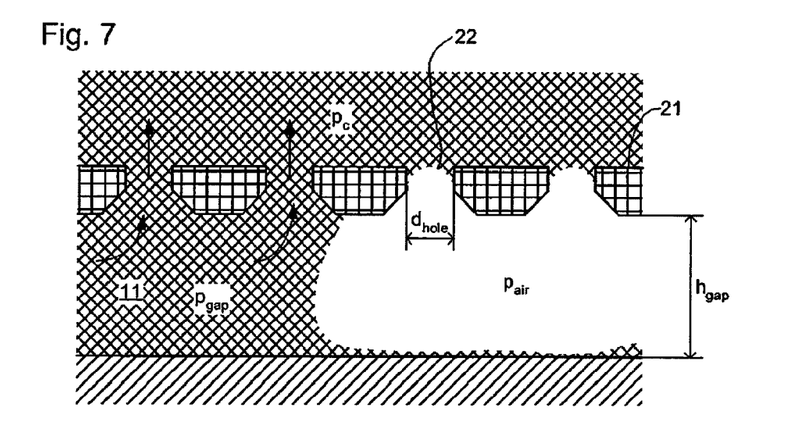
FIG. 7 is an enlarged view of part of FIG. 6.

FIGS. 6 and 7, the latter of which is an enlarged view of part of the former, illustrate a liquid removal device 20. The liquid removal device 20 comprises a chamber which is maintained at a slight underpressure $p_c$ and is filled with the immersion liquid. The lower surface of the chamber is formed of a thin plate 21 having a large number of small holes, e.g. of diameter $d_{hole}$ in the range of 5 to 50 μm, and is maintained at a height $h_{gap}$ less than 1 mm, desirably in the range of 50 to 300 μm, above a surface from which liquid is to be removed, e.g. the surface of a substrate W. In an embodiment, porous member 21 is at least slightly hydrophilic, i.e. having a contact angle of less than 90°, less than 60° or even less than 30° to the immersion liquid, e.g. water.

The underpressure $p_c$ is such that the menisci 22 formed in the holes in the porous member 21 prevent gas being drawn into the chamber of the liquid removal device. However, when the porous member 21 comes into contact with liquid on the surface W there is no meniscus to restrict flow and the liquid can flow freely into the chamber of the liquid removal device. Such a device can remove most of the liquid from the surface of a substrate W, though a thin film of liquid may remain, as shown in the drawings.

To improve or maximize liquid removal, the porous member 21 should be as thin as possible and the pressure differential between the pressure in the liquid $p_{gap}$ and the pressure in the chamber $p_c$ should be as high as possible, while the pressure differential between the pressure in the chamber $p_c$ and the pressure in the gas in the gap $p_{air}$ must be low enough to prevent significant amounts of gas being drawn into the liquid removal device 20. It may not always be possible to prevent gas being drawn into the liquid removal device but the porous member will prevent large uneven flows that may cause vibration. A micro-sieve made by electroforming, photo-etching and/or laser cutting may be used as the porous member 21. A suitable sieve is made by Stork Veco B.V., of Eerbeek, the Netherlands. Other porous plates or solid blocks of porous material may be used, provided the pore size is suitable to maintain a meniscus with the pressure differential that will be experienced in use.

Figure 8:
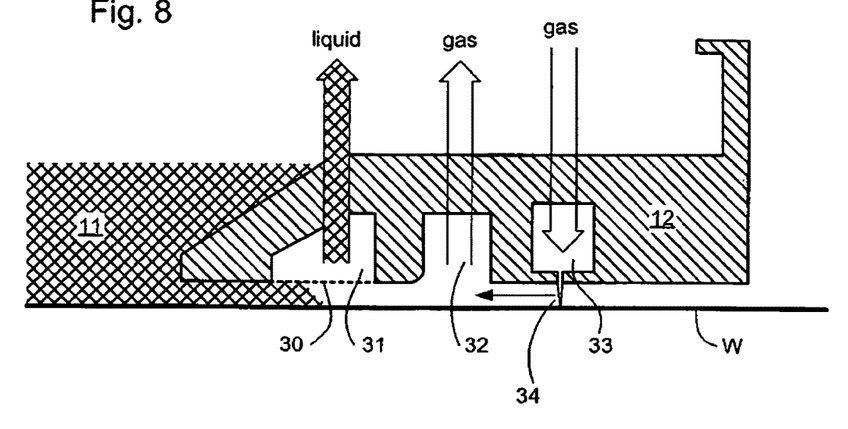
FIG. 8 depicts a liquid supply and removal system.

FIG. 8 shows a liquid removal device incorporated in a barrier member 12 of an immersion apparatus. FIG. 8 is a cross-sectional view of one side of the barrier member 12, which forms a ring (as used herein, a ring may be circular, rectangular or any other shape) at least partially around the exposure field of the projection system PL (not shown in FIG. 8). In this embodiment, the liquid removal device 20 is formed by a ring-shaped chamber 31 near the innermost edge of the underside of the barrier member 12. The lower surface of the chamber 31 comprises a porous member 30, as described above. Ring-shaped chamber 31 is connected to a suitable pump to remove liquid from the chamber and maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit in its lower part and is supplied with gas, e.g. air, artificial air or flushing gas, at a pressure such that the gas escaping out of the slit forms a gas knife 34 i.e. a jet of gas. The gas forming the gas knife is extracted by a suitable vacuum pump connected to the gas extraction ring 32 so that the resulting gas flow drives any residual liquid inwardly where it can be removed by the liquid removal device and/or the vacuum pump, which should be able to tolerate vapor of the immersion liquid and/or small liquid droplets. However, since the majority of the liquid is removed by the liquid removal device 20, the small amount of liquid removed via the vacuum system should not cause unstable flows which may lead to vibration.

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending partially along one or more sides of the exposure field, such as for example, shown in FIGS. 2, 3 and 4.

Figure 8A:
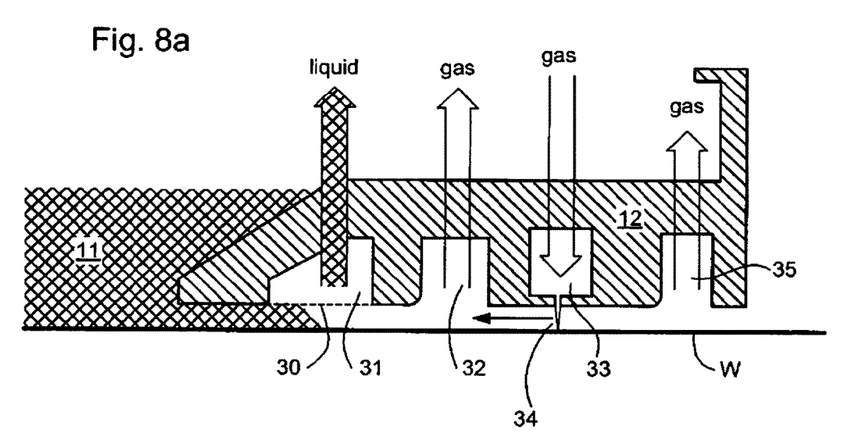

In the apparatus shown in FIG. 8, most of the gas that forms the gas knife is extracted via gas extraction ring 32, but some gas may flow into the environment around the immersion hood and potentially disturb the interferometric position measuring system IF. This may be prevented by the provision of an additional gas extraction ring 35 outside the gas knife, as shown in FIG. 8a. Because in this embodiment, the liquid removal system can remove most, if not all, of the immersion liquid while at a height of 50 to 300 μm above the surface of the substrate W or the substrate table WT, less onerous requirements are put on the barrier member vertical position than when a gas bearing is used to confine the immersion liquid. This means that the barrier member may be positioned vertically with a simpler actuation and control system. It also means that the requirements on the flatness of the substrate table and substrate may be reduced, making it easier to construct devices such as sensors provided in the upper surface of the substrate table WT.

Removal of most of the liquid without evaporation means that temperature gradients may be reduced, avoiding thermal deformation of the substrate, which can lead to printing errors. Evaporation may be further minimized by using humid gas in the gas knife, e.g. with a relative humidity of about 50 to 75%, in combination with a pressure drop of about 100 to 500 mbar and a flow rate of about 20 to 200 μl/min.

Figure 9:
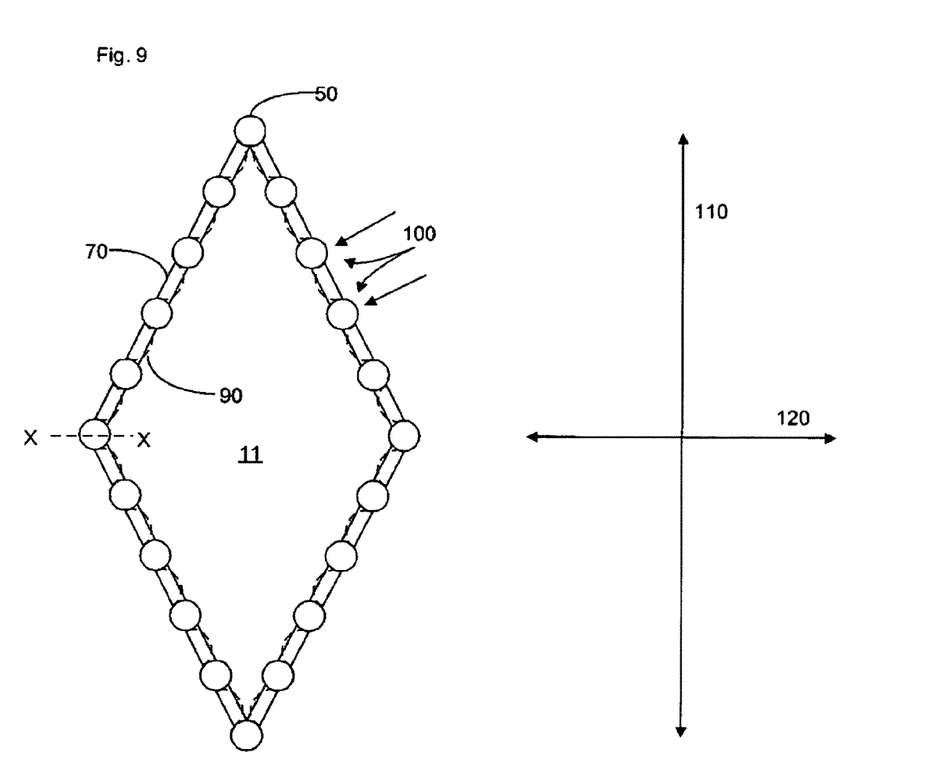
FIG. 9 illustrates, in plan, a meniscus pinning system.

FIG. 9 illustrates a meniscus pinning device like, for example, the meniscus pinning device 14, 15, 16 of FIG. 5. The meniscus pinning device of FIG. 9 comprises a plurality of discrete outlets 50. These outlets 50 are illustrated as being circular though this is not necessarily the case. Indeed the outlets may be square, oblong, triangular, elongate slits, etc. Some example shapes are given in FIG. 12.

Each of the outlets 50 of the meniscus pinning device of FIG. 9 may be connected to a separate underpressure source. Alternatively each outlet 50 may be connected to a common chamber (which may be annular) which is itself held at an underpressure. In this way a uniform underpressure at each outlet can be achieved. A ridge 70 may be provided between adjacent outlets 50. As can be seen from FIG. 10, which is a mirror-image cross-section through lines X-X in FIG. 9, in one embodiment the outlet 50 is formed in a protrusion from the bottom surface 40 of the barrier 12. The ridge 70 is positioned at the same height or protrudes by the same amount or less from the surface of the barrier member 12 as the outlet 50. The outlet 50 is an outlet of a tube or elongate passageway 55, for example. Desirably the outlet is positioned such that it faces the substrate. Another way of thinking of this is that an elongate axis of the passageway 55 to which the outlet 50 is connected is substantially perpendicular (say +/−45°, 35°, 25° or even 15° from perpendicular) to the top surface of the substrate W.

Each outlet 50 is designed to extract a mixture of liquid and gas. The liquid is extracted from the space 11 whereas the gas is extracted from the atmosphere on the other side of the outlets 50 and ridges 70 to the liquid. This creates a gas flow as illustrated by arrows 100 and this gas flow is effective to pin the meniscus 90 between the outlets 50 in place as illustrated in FIG. 9.

Figure 11:
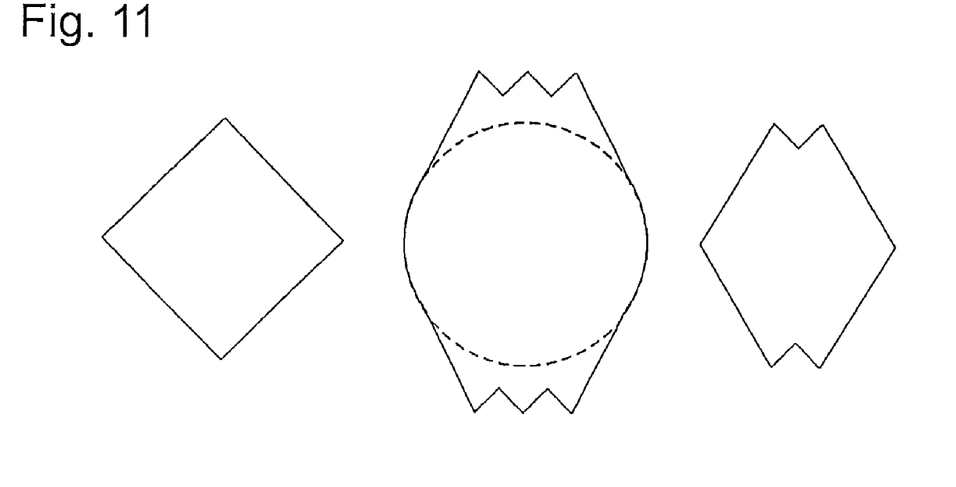
FIG. 11 illustrates, in plan, a further liquid confinement system.

As can be seen from FIG. 11, the outlets and ridges are positioned so as to form, in plan, a polygonal shape. In the case of FIG. 9 this is in the shape of a rhombus with the principal axes 110, 120 aligned with the major directions of travel of the substrate W under the projection system. This helps ensure that the maximum scan speed is faster than if the outlets and ridges 70 were arranged in a circular shape. This is because the force on the meniscus between two outlets is reduced with a factor $\cos \theta$ where $\theta$ is the angle of the line connecting the two outlets relative to the direction in which the substrate W is moving. Thus, throughput may be optimized by making the primary axis 110 of the shape of the outlets aligned with the major direction of travel of the substrate (usually the scan direction) and to have a second axis 120 aligned with the other major direction of travel of the substrate (usually the step direction). It will be appreciated that any arrangement in which $\theta$ is different to 90° will give an advantage. Thus, exact alignment of the principal axes with the major directions of travel is not vital. It will further be appreciated that if the shape is circular, then there will always be two outlets 50 which are aligned perpendicular to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. The ratio of the principal dimension of a square to the minor dimension is $\sqrt{2}:1$ and any shapes with such a ratio of greater than 1.2:1 are particularly suitable. For shapes with two principal axes, a length ratio of between 4/9 and 8/9, desirably between 5/9 and 7/9, may be suitable bearing in mind the amount and speed of movement in the step and scan directions.

Figure 10:
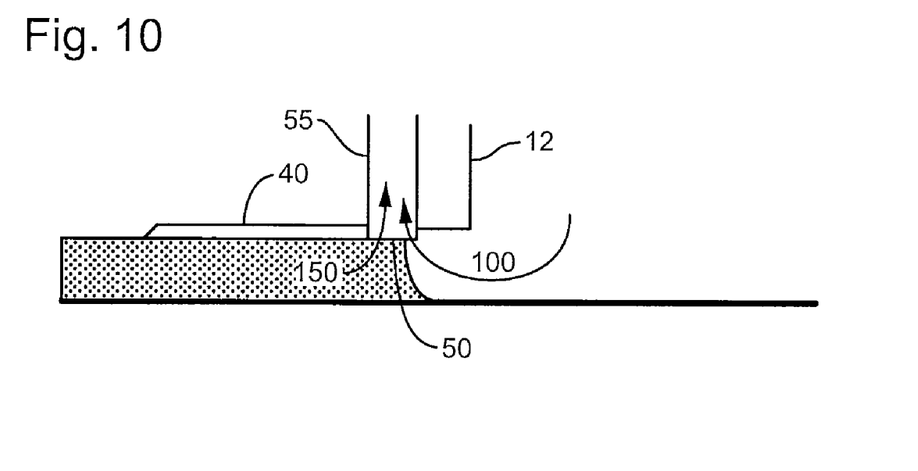
FIG. 10 depicts, in cross-section in a plane parallel to the optical axis of the projection system, a meniscus pinning system.

FIG. 10 illustrates that the outlet 50 is provided in a protrusion from the bottom surface 40 of the barrier member 12. This is however not necessarily the case and the outlets 50 may be in the major bottom surface of the barrier member 12. In this case the liquid will abut the major bottom surface and thus not have a free top surface which is prone to the undesirable generation of waves. In this case there is no definable ridge 70. Arrow 100 shows the flow of gas from outside of the barrier member 12 into the passageway 55 associated with the outlet 50 and the arrow 150 illustrates the passage of liquid from the space 11 into the outlet 50. The passageway 55 and outlet 50 are designed so that two phase extraction (i.e. gas and liquid) occurs in an annular flow mode in which gas flows through the center of the passageway 55 and liquid flows along the walls of the passageway 55. This results in smooth flow without the generation of pulsations.

In FIG. 10, the level of liquid in the space 11 is arranged such that it does not touch the bottom surface 40 of the barrier member 12 even radially inwardly of the outlets 50. As discussed above, that is however not necessarily the case. In this embodiment, there are no meniscus pinning features radially inwardly of the outlets 50 and neither are there any other components or meniscus pinning features radially outwardly of the outlets 50. Thus, in comparison to the liquid confinement system of FIG. 5, there is no gas inlet 15 or equivalent and the outlet 14 has been split into several discrete outlets 50 each connected to an underpressure source. The meniscus is pinned between the outlets 50 with drag forces induced by gas flow into the outlets 50. A gas velocity of greater than about 15 m/s, desirably 20 m/s may be sufficient to create the desired drag force. By avoiding the need for a gas knife as is present in one or more other liquid confinement systems, the amount of evaporation of liquid from the substrate may be reduced thus reducing both splashing of liquid as well as thermal expansion/contraction effects.

In an embodiment, 36 discrete needles as outlets 50 each with a diameter of 1 mm and separated by 3.9 mm is effective to pin a meniscus. The total gas flow in such a system is of the order of 100 l/min.

FIG. 11 shows, in plan, other geometries of arrangements of outlets which may be possible. These include a square, a variant on a circle (shown in dotted lines) in which extensions at the top and bottom have been added which have the desired angle relative to the principal direction of travel. This design could be further modified to include similar extension for the other principal direction of travel. These shapes can be regarded as part stars, part circles. A complete star shape would also work well. The final example is similar to the circle/star embodiment, but comprises all straight lines.

Figure 12:
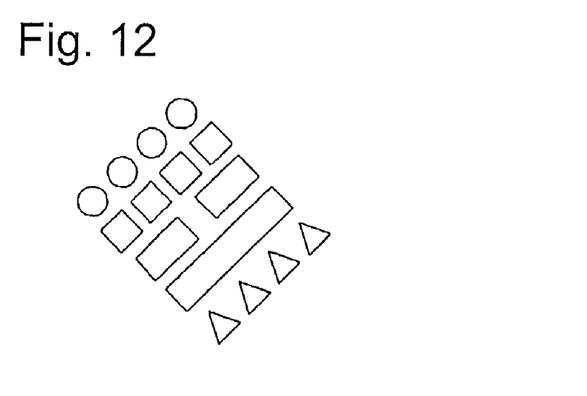
FIG. 12 illustrates various different outlets.

FIG. 12 illustrates some potential shapes of outlets and different spacings between the individual outlets.

As will be appreciated from the above, measures may advantageously be taken to ensure that, in plan, the shape of the extractor around the space is such that the angle the extractor makes to the direction of movement is as far as possible removed from 90°. This reduces the relative velocity across the extractor. However, a disadvantage of this arrangement is the increase in size (in plan) of the liquid handling system and thus a loss in the ability to reach all parts of the top surface of the substrate table WT. An embodiment of the present invention is illustrated in FIG. 13 and addresses this and/or another problem.

Figure 13:
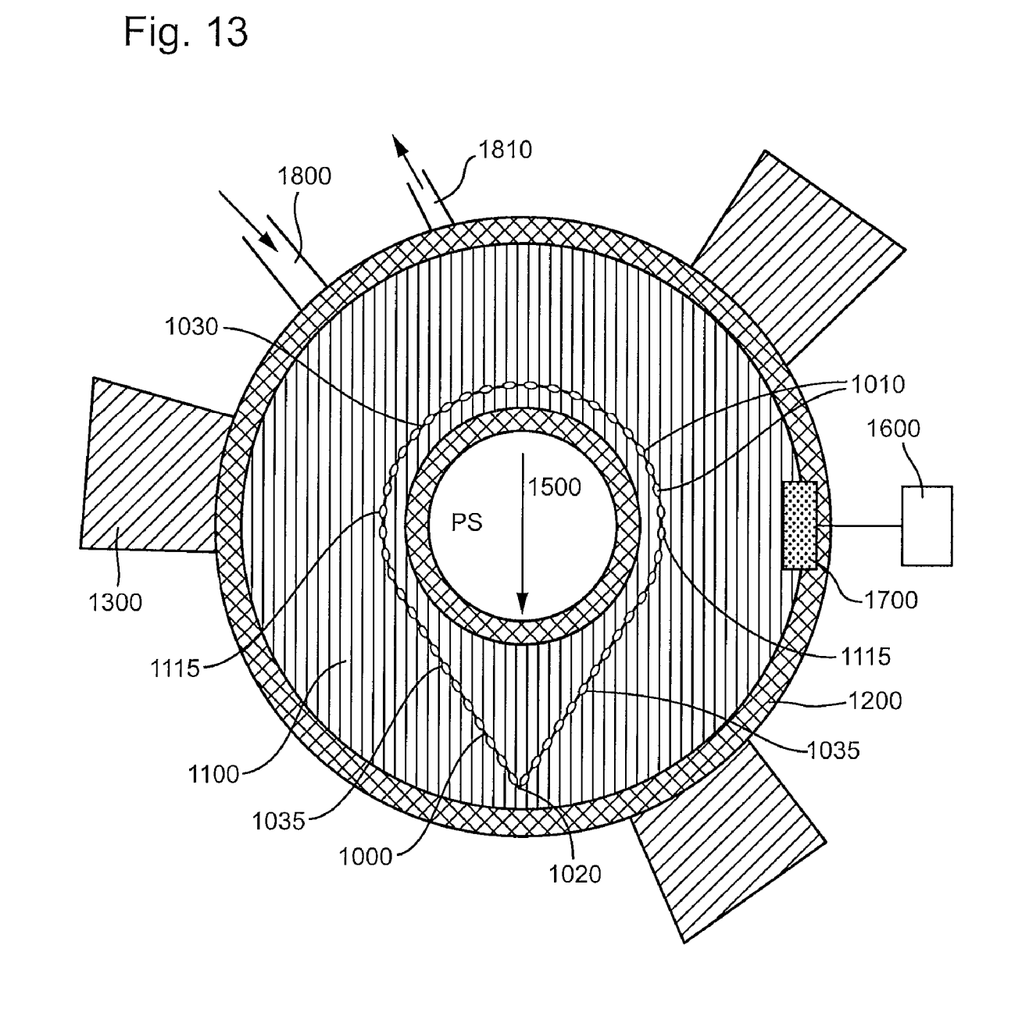
FIG. 13 illustrates, in a view from below, an embodiment of the present invention.

FIG. 13 is a view from below a liquid handling system. The shape of a containment or meniscus pinning feature or features or extractor is illustrated by line 1000. Any type of feature or features which exert a force on liquid can be used. For example the gas seal of FIG. 5 could be used, or the extractor of FIGS. 6-10. The feature or features are formed in a surface and have an overall shape in plan. An embodiment of the present invention will be described in relation to an extractor (in which the features are outlets 50), but an embodiment of the invention may be applied to other containment or meniscus pinning or extracting feature or features.

In FIG. 13 an extractor comprising a plurality of discrete outlets 1010 is illustrated. These outlets are the same as the outlets of the FIG. 9 embodiment. The outlets are provided on a rotatable part 1100 of the liquid handling system and are arranged to define a liquid confinement structure. Thus, the rotatable part 1100 provides the surface in which the feature or features are formed. The rotatable part 1100 is mounted within a body 1200.

The rotatable part 1100 is rotatable relative to the body 1200 about an axis which is substantially parallel or co-axial with the optical axis of the projection system PS. The body 1200 is held substantially stationary relative to the projection system PS, as in the other embodiments. For this purpose, the body 1200 is attached to a frame, for example a base frame or a reference frame of the apparatus, by connecting members 1300, for example.

In an embodiment, movements of the body 1200 relative to the projection system PS may be made. In particular, a tilting movement about orthogonal axes parallel to the plane of the top surface of the substrate W may be possible. Small (e.g. incidental) rotations about an axis substantially parallel or co-axial with the optical axis of the projection system may be possible. Furthermore, movement in a plane parallel to the top surface of the substrate W may be possible as may movement in a direction substantially parallel to the optical axis.

As can be seen, the extractor 1000 has a shape, in plan, which has only one corner 1020. That is, there is only one place in the shape at which two lines converge or intersect. The single corner 1020 is the only sharp point of the shape of the extractor 1000. The remainder of the shape is smooth and one portion 1030 may be substantially semi-circular. The semi-circular portion 1030 is opposite the single corner. Lines of the semi-circle are continued, at least in part, as substantially straight lines 1035. Where the straight lines 1035 meet is the single corner 1020. Therefore, the shape, in plan, of the extractor 1000 is asymmetrical. This has an advantage in that the wet footprint will be narrower than in other systems. This may result in easier thermal conditioning of the substrate W and the scanning surface layout.

As will be appreciated, if a substrate W is moved in direction 1500 relative to the liquid handling system, the single corner 1020 will provide a trailing edge and the semi-circular circular portion 1030 will provide a leading edge. That is, a part of a substrate W moving under the projection system PS will first encounter the leading edge 1030 before encountering the trailing edge 1020.

It is at the trailing edge where it is significant that the liquid is properly sealed i.e. the meniscus is properly pinned. Such pinning enables a faster speed, especially linear velocity during scanning, between a substrate and/or substrate table and the liquid handling system. The meniscus may be less well pinned at the leading edge of the extractor 1000 because a part of a substrate W under that point is in any case going to be exposed to the immersion liquid later. After that point has passed under the trailing edge, that point will not necessarily again come under the projection system PS and it is here that it is desirable that little or no liquid is left behind on the substrate.

Therefore, by providing a controller 1600 to control the relative rotation of the rotatable part 1100 to the body 1200 it is possible to line up the extractor 1000 such that for any movement the single corner 1020 forms the trailing edge. An actuator 1700 can be controlled by the controller 1600 to help ensure this.

The actuator 1700 may be fully enclosed within the liquid handling system. For example, it may be housed within the body 1200 and/or the rotatable part 1100.

As will be appreciated, any position of the rotatable part 1100 which reduces the amount of length of the extractor (particularly the trailing edge) which is perpendicular to the direction of travel or which increases the angle of the extractor to the direction of travel away from perpendicular is useful in enabling the speed with which a substrate may be passed under the projection system to be increased; as described above, arranging for this geometry may increase the speed at which liquid escapes and thereby allow faster scanning below the projection system PS. Put another way, the controller rotates the rotatable part 1100, and thus the shape, to help reduce the maximum speed of the substrate or substrate table which moves under the extractor relative to the extractor in a direction perpendicular to a local direction of the trailing edge of the shape (i.e. the component in that direction is reduced). The trailing edge is that part of the extractor where the relative direction of movement of a point on the substrate below the part of the extractor being considered relative to the extractor contains little or no component in a direction towards the space. Generally if the single corner 1020 is within the central 25% of the trailing edge, a significant advantage may be achieved. In an embodiment, the single corner is in the center of the trailing edge i.e. the trailing edge is between points 1115 (in the embodiment of FIG. 13 at the end of the semi-circular part 1030). The orientation of the shape is optimized for the given direction of movement of the substrate table WT.

As will be appreciated, other shapes of extractor 1000 may be possible. Any angle less than 180° should increase the scan speed. The sharper the angle made by the two straight lines 1035 the better. Desirably the angle is less than 90°, less than 70°, or less than 50°, or even lower.

The arrangement of a stationary body 1200 and a rotating part 1100 is advantageous because this allows an inlet port 1800 for the provision of liquid to the liquid handling system to be stationary to the rest of the apparatus. Similarly, an outlet port 1810 may be provided for the removal of liquid and/or gas from the liquid handling system. Clearly more ports could be provided for the provision or removal of further consumables. Any outlets or inlets formed in the rotatable part 1100 could be in fluid communication with the inlet and outlet ports 1800, 1810 through ridges in the outer periphery of the rotatable part 1100 intersecting one or more holes in the surface of the body 1200 which the outer surface of the rotatable part 1100 is adjacent to. By providing the holes and recesses at different heights, the consumables can be kept separate.

Although it is illustrated in FIG. 13 that only outlets are provided in the rotatable part 1100, this is not necessarily the case. For example, it may be advantageous to provide liquid to the space through an inlet in the rotatable part 1100. In that case the provision of liquid could be provided at the optimal orientation relative to the direction of movement 1500. Additionally or alternatively there may be an inlet in the inner part of the body 1200 for the provision of liquid to the space. An inlet may be provided both in the body 1200 and in the rotatable part 1100. Indeed, that may be optimal because then the liquid can be provided to the top of the space close to the final element of the projection system PS through the body 1200 and liquid may be provided to a part closer to the substrate W from an inlet in the rotatable part 1100. There may be further outlets in the rotatable part 1100, for example, radially inwardly of the extractor 1000. There may be outlets in the inner part of the body 1200. Furthermore, there may be other components of the containment/meniscus pinning feature radially outwardly of the extractor 1000. Such further features may or may not have the same or a similar shape to that of the extractor 1000.

The controller 1600 can receive information from a controller which controls the movement of the substrate table WT under the projection system PS. In this way the control of the relative rotation of the rotatable part 1100 to the body 1200 is controlled in a feed-forward manner. That is, the controller 1600 knows the direction of scan 1500 and can rotate the rotatable member 1100 using actuator 1700 accordingly. Alternatively or additionally, a sensor can detect the direction of scan and this information can be provided to the controller 1600 so that the relative rotation of the rotatable part 1100 to the body 1200 can be done in a feed-back manner.

An advantages of an embodiment of the present invention is that scan speed may be increased and indeed movement in any direction may be increased, thus increasing throughput. Furthermore, this may be achieved at a low cost in terms of space for the liquid handling system. Also, the arrangement is better than rotating the whole of the liquid handling system because of the stationary nature of the ports 1800, 1810.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a liquid handling system comprising a feature configured to exert a force on a liquid to contain the liquid in a space to which immersion liquid is provided in use, the feature surrounding the space and having, in plan, a shape with only one corner.

2. The immersion lithographic apparatus of claim 1, wherein the feature is rotatable about an axis substantially parallel to an optical axis of the apparatus to change the orientation of the shape.

3. The immersion lithographic apparatus of claim 2, further comprising a controller configured to control rotation of the shape around the axis to reduce the maximum speed of a substrate and/or substrate table movable under the feature relative to the feature in a direction substantially perpendicular to a local direction of a trailing edge of the shape.

4. The immersion lithographic apparatus of claim 2, wherein the controller is configured to control rotation around the axis such that the only one corner is within the central 25% of a trailing edge of the shape.

5. The immersion lithographic apparatus of claim 1, wherein the liquid handling system comprises a body and a rotatable part, wherein:
   the body is held substantially rotationally stationary relative to a projection system, and
   the rotatable part comprises the feature and is rotatable about an axis substantially parallel to an optical axis of the projection system and relative to the body to allow rotation of the shape.

6. The immersion lithographic apparatus of claim 1, wherein the feature comprises a single phase extractor.

7. The immersion lithographic apparatus of claim 1, wherein the feature comprises a plurality of outlets in a line to remove a mixture of (i) liquid from the space and (ii) gas from the atmosphere outside of the space.

8. The immersion lithographic apparatus of claim 1, wherein the feature comprises an outlet connected to an underpressure source.

9. The immersion lithographic apparatus of claim 1, wherein the only one corner forms an acute angle of less than 90°.

10. The immersion lithographic apparatus of claim 1, wherein a portion of the shape is an arc of a circle.

11. The immersion lithographic apparatus of claim 1, wherein the shape, apart from the only one corner, is smooth.

12. An immersion lithographic apparatus comprising:
a movable table;
a liquid handling system comprising:
  a body held substantially rotationally stationary relative to a projection system;
  a rotatable part with a corner configured to be rotatable relative to the body about an axis substantially parallel to an optical axis of the projection system, the rotatable part comprising an inlet to provide liquid and/or gas, or an outlet to remove liquid and/or gas, or both the inlet and the outlet; and
  a controller configured to align the corner with a direction of movement of the movable table.

13. The immersion lithographic apparatus of claim 12, wherein the inlet and/or outlet in the rotatable part is in fluid communication with a passage in the body.

14. The immersion lithographic apparatus of claim 12, wherein the liquid handling system comprises an inlet constructed and arranged to provide liquid to a space surrounded by the rotatable part between a final element of the projection system and a substrate and/or substrate table.

15. The immersion lithographic apparatus of claim 14, comprising an inlet formed in the body.

16. The immersion lithographic apparatus of claim 14, comprising an inlet formed in the rotatable part.

17. The immersion lithographic apparatus of claim 16, comprising an inlet formed in the body.

18. The immersion lithographic apparatus of claim 12, wherein the rotatable part comprises a feature configured to extract liquid from and/or contain liquid in a space surrounded by the liquid handling system and between a final element of the projection system and a substrate and/or substrate table.

19. The immersion lithographic apparatus of claim 12, wherein the rotatable part does not comprise an inlet to provide liquid to a space between a final element of the projection system and a substrate and/or substrate table.

20. The immersion lithographic apparatus of claim 12, further comprising an actuator configured to rotate the rotatable part relative to the body, the actuator being housed within the body and/or the rotatable part.

21. An immersion lithographic apparatus comprising:
a feature that surrounds a space to which liquid is provided in use, the feature being constructed and arranged to contain liquid in a space to which liquid is provided in use and having, in plan, a shape, wherein the feature is rotatable around an axis substantially parallel to an optical axis of the apparatus; and
a controller constructed and arranged to control rotation of the feature around the axis and to rotate the shape to reduce the maximum speed of a substrate and/or substrate table movable under the feature relative to the feature in a direction substantially perpendicular to a local direction of a trailing edge of the shape.

22. The immersion lithographic apparatus of claim 21, wherein the shape has a single corner.

23. The immersion lithographic apparatus of claim 22, wherein the single corner forms an acute angle of less than 90°.

24. The immersion lithographic apparatus of claim 22, wherein the shape, apart from the single corner, is smooth.

25. The immersion lithographic apparatus of claim 21, wherein the liquid handling system comprises a body and a rotatable part, wherein:
the body is held substantially rotationally stationary relative to a projection system, and
the rotatable part comprises the feature and is rotatable about an axis substantially parallel to an optical axis of the projection system and relative to the body.

26. The immersion lithographic apparatus of claim 21, wherein the feature comprises a single phase extractor.

27. The immersion lithographic apparatus of claim 21, wherein the feature comprises a plurality of outlets in a line to remove a mixture of (i) liquid from the space and (ii) gas from the atmosphere outside of the space.

28. The immersion lithographic apparatus of claim 21, wherein the feature comprises an outlet connected to an underpressure source.

29. The immersion lithographic apparatus of claim 21, wherein a portion of the shape is an arc of a circle.

30. An immersion lithographic apparatus comprising:
a substrate support configured to support a substrate;
a liquid handling system comprising a liquid confinement structure shaped in a plan view to have a corner; and
a controller configured to control the position of the liquid confinement structure such that the corner is positioned at a trailing edge of the liquid confinement structure during relative movement between the liquid handling system and the substrate and/or the substrate support.

31. The immersion lithographic apparatus of claim 30, wherein the liquid handling system is constructed and arranged to provide a liquid between the substrate and/or substrate support and a projection system of the immersion lithographic apparatus.

32. The immersion lithographic apparatus of claim 31, wherein the liquid confinement structure comprises a plurality of outlets constructed and arranged to extract liquid during relative movement between the liquid handling system and the substrate and/or substrate support.

* * * * *